US008982362B2

(12) United States Patent
Milshtein

(10) Patent No.: US 8,982,362 B2
(45) Date of Patent: Mar. 17, 2015

(54) SYSTEM AND METHOD FOR MEASURING LAYER THICKNESS AND DEPOSITING SEMICONDUCTOR LAYERS

(71) Applicant: First Solar, Inc., Perrysburg, OH (US)

(72) Inventor: Erel Milshtein, Cupertino, CA (US)

(73) Assignee: First Solar, Inc., Perrysburg, OH (US)

( * ) Notice: Subject to any disclaimer, the term of this patent is extended or adjusted under 35 U.S.C. 154(b) by 218 days.

(21) Appl. No.: 13/645,000

(22) Filed: Oct. 4, 2012

(65) Prior Publication Data

US 2013/0095577 A1 Apr. 18, 2013

Related U.S. Application Data

(60) Provisional application No. 61/543,112, filed on Oct. 4, 2011.

(51) Int. Cl.

| | |
|---|---|
| ***G01B 11/28*** | (2006.01) |
| ***G01N 21/86*** | (2006.01) |
| ***G01V 8/00*** | (2006.01) |
| ***G01B 11/06*** | (2006.01) |
| ***H01L 21/02*** | (2006.01) |
| ***H01L 21/66*** | (2006.01) |
| ***C23C 16/455*** | (2006.01) |
| ***C23C 16/52*** | (2006.01) |

(Continued)

(52) U.S. Cl.

CPC ........ *G01B 11/0683* (2013.01); *H01L 21/0262* (2013.01); *H01L 22/26* (2013.01); *G01B 11/0625* (2013.01); *H01L 22/12* (2013.01); *C23C 16/45525* (2013.01); *C23C 16/52* (2013.01); *H01L 31/073* (2013.01); *H01L 31/0749* (2013.01); *H01L 31/18* (2013.01); *Y02E 10/541* (2013.01)

USPC ...................................... 356/630; 250/559.27

(58) Field of Classification Search

CPC .... G01B 11/0683; G01B 11/0625; G01J 3/46

USPC ............................. 356/630, 625; 250/559.27

See application file for complete search history.

(56) References Cited

U.S. PATENT DOCUMENTS 4,785,336 A * 11/1988 McComb et al. ............ 356/632
5,056,923 A * 10/1991 Ebisawa et al. .............. 356/632

(Continued)

FOREIGN PATENT DOCUMENTS

JP 08304035 A * 11/1996 ............ G01B 11/06

OTHER PUBLICATIONS

Moreau et al. "Contrast and colorimetry measurements versus viewing angle for Microdisplays", Proceedings of SPIE vol. 4207 (Dec. 28, 2000).*

*Primary Examiner* — Kara E Geisel
*Assistant Examiner* — Dominic J Bologna
(74) *Attorney, Agent, or Firm* — Dickstein Shapiro LLP

(57) ABSTRACT

Described herein is a method and apparatus for measuring the thickness of a deposited semiconductor material. A colorimeter has an optical source that illuminates a portion of a deposited semiconductor material with optical radiation, a sensor that collects and measures color information related to reflected radiation from the deposited semiconductor material, and a processor that receives the color information related to the reflected radiation from the sensor and calculates a thickness of the semiconductor material. The processor may control a semiconductor material deposition apparatus.

18 Claims, 6 Drawing Sheets

5 43 65 10 112 θ 75 21 91 15 101 124 123 400 300 500 600

(51) Int. Cl.
*H01L 31/073* (2012.01)
*H01L 31/0749* (2012.01)
*H01L 31/18* (2006.01)

(56) References Cited

U.S. PATENT DOCUMENTS 5,131,752 A * 7/1992 Yu et al. ........................ 356/369
5,396,080 A * 3/1995 Hannotiau et al. ....... 250/559.28
5,665,214 A * 9/1997 Iturralde .................. 204/298.03
6,694,284 B1 2/2004 Nikoonahad et al.
6,891,627 B1 5/2005 Levy et al.
7,358,748 B1 4/2008 Miller et al.
7,469,164 B2 12/2008 Du-Nour
7,719,294 B1 5/2010 Samsavar et al.
7,848,020 B2 12/2010 Hendrix et al.
2002/0093648 A1* 7/2002 Nikoonahad et al. ...... 356/237.1
2002/0097406 A1 7/2002 Fielden et al.
2002/0102749 A1 8/2002 Fielden et al.
2002/0103564 A1 8/2002 Fielden et al.
2002/0106848 A1 8/2002 Wack et al.
2002/0107650 A1 8/2002 Wack et al.
2002/0107660 A1 8/2002 Nikoonahad et al.
2002/0179864 A1 12/2002 Fielden et al.
2002/0180961 A1 12/2002 Wack et al.
2002/0180986 A1 12/2002 Nikoonahad et al.
2003/0086080 A1* 5/2003 Guan et al. ................. 356/237.1
2004/0073398 A1 4/2004 Nikoonahad et al.
2004/0200574 A1 10/2004 Davis et al.
2004/0235205 A1 11/2004 Levy et al.
2005/0068540 A1* 3/2005 De Groot et al. ............. 356/512
2006/0110531 A1* 5/2006 Chang et al. ............... 427/248.1
2006/0176487 A1* 8/2006 Cummings et al. ........... 356/445
2006/0289790 A1* 12/2006 Raymond et al. .......... 250/459.1
2007/0139771 A1 6/2007 Wang et al.
2008/0013083 A1 1/2008 Kirk et al.
2008/0077362 A1 3/2008 Willis et al.
2008/0183411 A1 7/2008 Funk et al.
2009/0200279 A1 8/2009 Li
2009/0218314 A1* 9/2009 Davis et al. ..................... 216/60
2010/0004773 A1 1/2010 Kochergin
2010/0124610 A1 5/2010 Aikawa et al.
2010/0227046 A1* 9/2010 Kato et al. ...................... 427/10
2010/0235114 A1 9/2010 Levy et al.

* cited by examiner

SYSTEM AND METHOD FOR MEASURING LAYER THICKNESS AND DEPOSITING SEMICONDUCTOR LAYERS

CLAIM OF PRIORITY

This application claims priority under 35 U.S.C. §119(e) to U.S. Provisional Patent Application Ser. No. 61/543,112 filed on Oct. 4, 2011, which is hereby incorporated by reference in its entirety herein.

FIELD OF THE INVENTION

The disclosed embodiments relate to photovoltaic devices and methods of manufacturing the same.

BACKGROUND OF THE INVENTION

Photovoltaic devices convert the energy of sunlight directly into electricity by the photovoltaic effect. Photovoltaic devices include semiconductor material deposited over a substrate, including, for example, a semiconductor emitter or window layer adjacent to a semiconductor absorber layer. The semiconductor window/emitter layer allows the penetration of solar radiation to the absorber layer, which converts solar energy to electricity. A conductor may be deposited adjacent to the semiconductor absorber layer to serve as a back contact for the device. A transparent front contact may be deposited on the side of the window/emitter layer. Since layer thickness has a substantial impact on device performance, it is desirable to accurately measure layer thickness and control the deposition thickness of one or more layers in the photovoltaic device in real time.

DETAILED DESCRIPTION OF THE INVENTION

In the following detailed description, reference is made to the accompanying drawings, which form a part hereof, and in which is shown by way of illustration specific embodiments that may be practiced. It should be understood that like reference numbers represent like elements throughout the drawings. Embodiments are described with sufficient detail to enable those skilled in the art to practice them. It is to be understood that other embodiments may be employed, and that various structural, logical, and electrical changes may be made without departing from the spirit or scope of the invention.

Photovoltaic modules can include a plurality of photovoltaic cells or devices. A photovoltaic device can include multiple layers created on a substrate (or superstrate). For example, a photovoltaic device can include a transparent conductive oxide (TCO) layer, a buffer layer, and semiconductor layers formed in a stack on a substrate. The semiconductor layers can include a semiconductor emitter layer (window layer), such as a zinc oxide layer, formed on the buffer layer and a semiconductor absorber layer, such as a cadmium telluride layer, formed on the semiconductor emitter layer. Additionally, each layer can cover all or a portion of the device and/or all or a portion of the layer or substrate underlying the layer. For example, a "layer" can include any amount of any material that contacts all or a portion of a surface.

Figure 1:
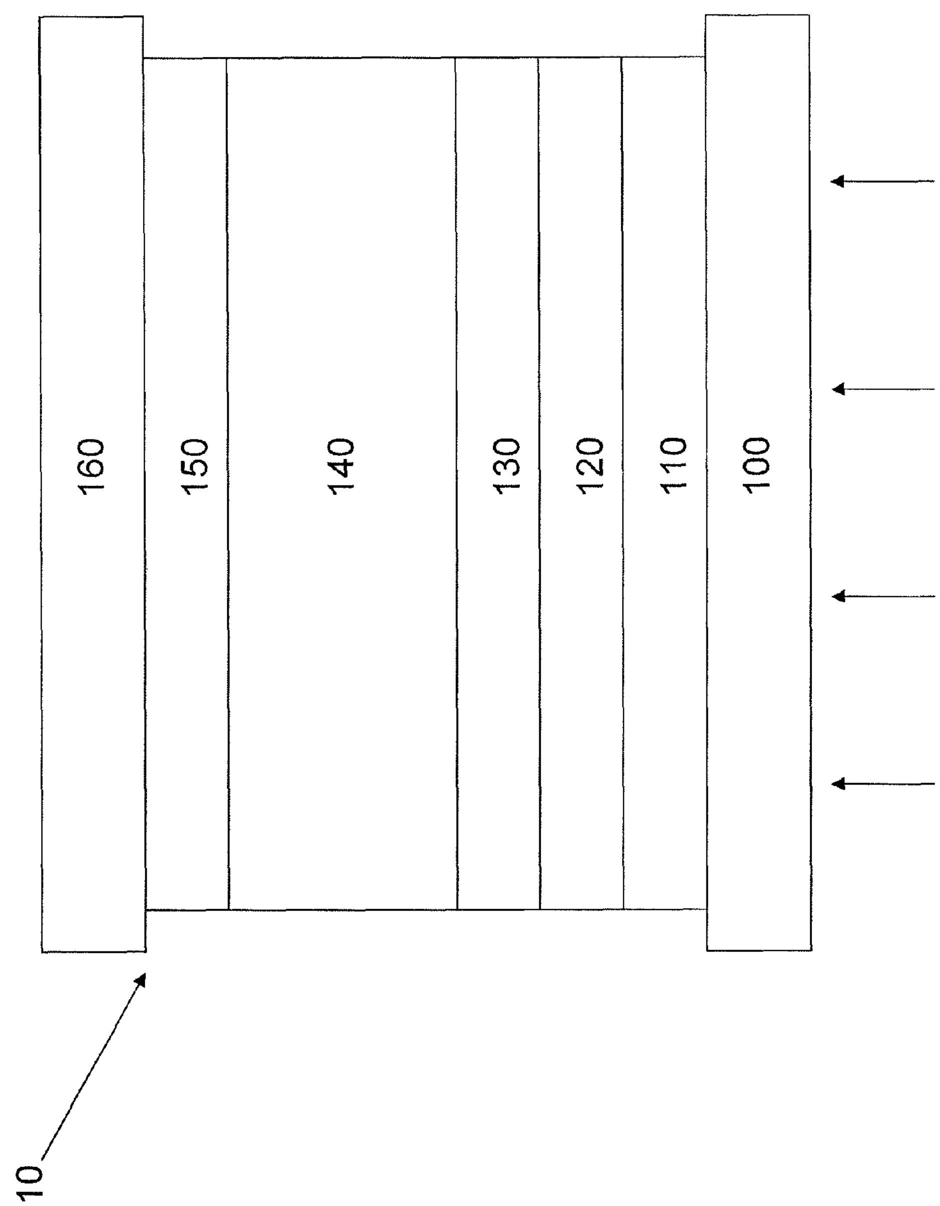
FIG. 1 is a cross-sectional view of a photovoltaic device having multiple layers.

Photovoltaic devices can be built from the front side, which receives incident radiation in use, to the back side or from the back side to the front side. Referring to FIG. 1, one example of a photovoltaic device construction is shown where cadmium telluride-based photovoltaic device 10 is formed from the front side to the back side. A front contact 110 is formed on substrate (front support) 100. Substrate 100 may be glass, for example, soda-lime glass. Front contact 110 can be a transparent conductive oxide layer, and can be, for example, a transparent conductive oxide (TCO) such as tin oxide or tin oxide doped with fluorine. Front contact 110 can be deposited using any suitable technique, including, for example, sputtering, and may include any suitable contact material, including, for example, chromium or molybdenum. Front contact 110 may also include one or more dopants, including, for example, sodium.

As shown by the arrows in FIG. 1, light enters photovoltaic device 10 from the side of substrate 100. A cadmium sulfide buffer layer 120 is deposited over front contact 110. Cadmium sulfide buffer layer 120 can have a thickness of about 500 Å. Cadmium sulfide buffer layer 120 can be deposited using any known deposition technique, including, for example, vapor transport deposition. Window/emitter layer 130, which is a semiconductor layer, is formed over buffer layer 120. Absorber layer 140, which is also a semiconductor layer, is formed over window/emitter layer 130. Window/emitter layer 130 and absorber layer 140 can include, for example, a binary semiconductor such as group II-VI or III-V semiconductors, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InS, InN, InP, InAs, InSb, TlN, TlP, TlAs, TlSb, or mixtures thereof. An example of a window layer and absorbing layer can be a layer of CdS and a layer of CdTe, respectively. Window/emitter layer 130 is thinner than absorber layer 140. A thinner window/emitter layer 130 allows greater penetration of the shorter wavelengths of incident light to absorber layer 140. The thickness of window/emitter layer 130 may be measured and controlled using the systems and methods discussed herein. Back contact 150 is formed over absorber layer 140. Back support 160 is formed over back contact 150.

Figure 2:
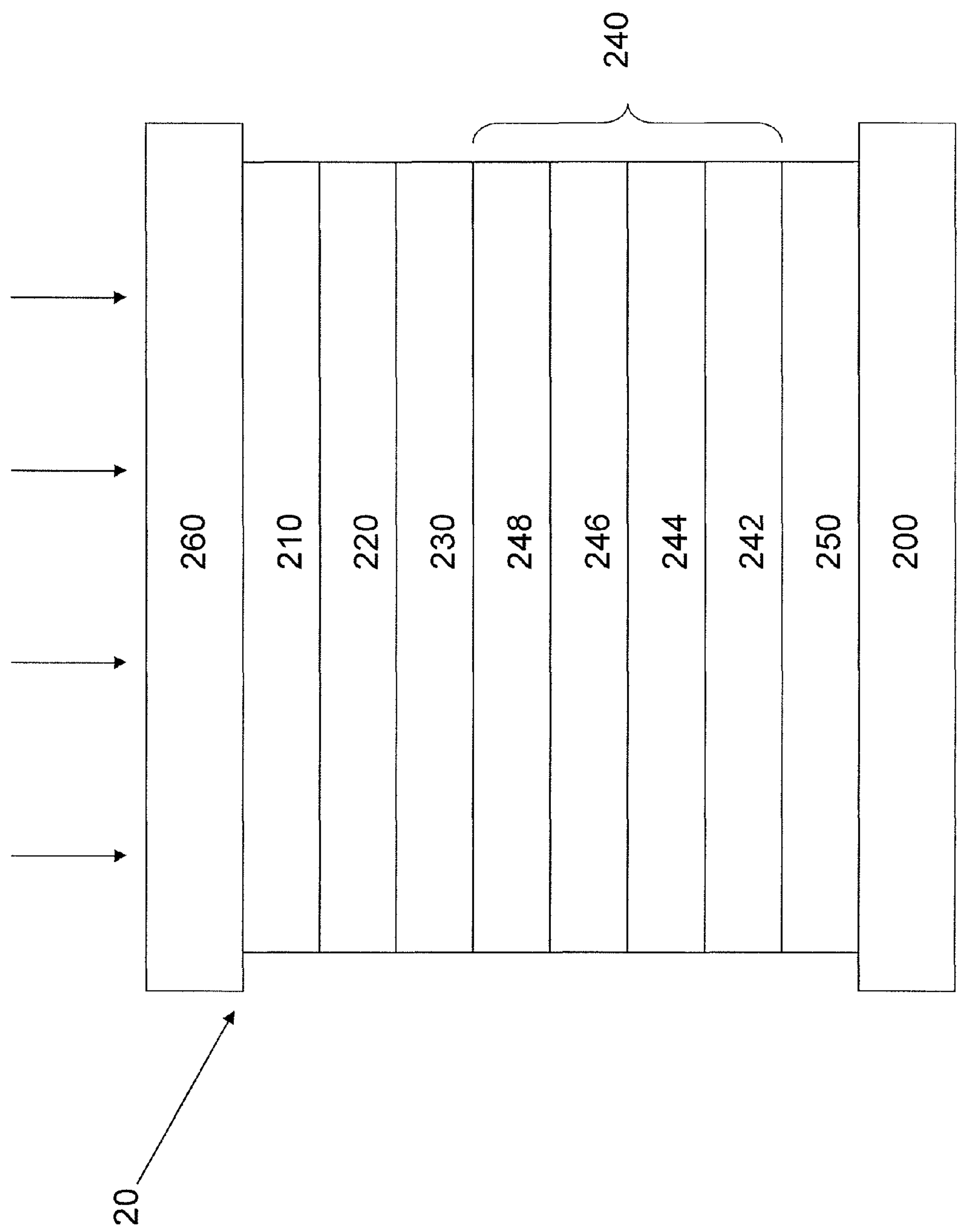
FIG. 2 is a cross-sectional view of a photovoltaic device having multiple layers.

Referring to FIG. 2, another example of a photovoltaic device construction is shown where copper-indium-gallium-diselenide-based photovoltaic device 20 is formed from the back side to the front side. Back contact 250 is formed over substrate (back support) 200. Back contact 250 may include any suitable metallic material, including, for example, molybdenum, aluminum, chromium, iron, nickel, titanium, vanadium, manganese, cobalt, zinc, ruthenium, tungsten, silver, gold, or platinum, which can be mixtures or alloys thereof. Absorber layer 240 is fowled over back contact 250. In this embodiment, absorber layer 240 is a copper-indium-gallium-diselenide (CIGS) layer. CIGS layer 240 may include copper layer 242, gallium layer 244, indium layer 246, and selenium layer 248. CIGS layer 240 can be formed and deposited using any suitable method. For example, substrate 200 and back contact metal 250 can be heated to a deposition temperature above about 200° C. A copper layer can be evaporated over the substrate layers; a gallium layer can be sputtered onto the copper; and then an indium layer and a selenium layer can be co-evaporated over the gallium. Alternatively, the copper, gallium, indium, and selenium can be co-evaporated over the substrate. In one variation, the copper, gallium, and indium all go through a selenization process. For example, the copper, gallium, and indium can be deposited and then heated in the presence of a selenium flux. Alternatively, the copper, gallium, and indium can be deposited in the presence of a hydrogen selenide gas.

Window/emitter layer 230 is formed over CIGS layer 240. Window/emitter layer 230 may be deposited using various deposition techniques, including vapor transport deposition, close space sublimation, and atomic layer deposition (ALD). A cadmium sulfide buffer layer 220 can be deposited over window/emitter layer 230. Cadmium sulfide buffer layer 220 can have a thickness of about 500 Å. Cadmium sulfide buffer layer 220 can be deposited using any known deposition technique, including, for example, vapor transport deposition. Window/emitter layer 230 can include, for example, a binary semiconductor such as group II-VI or III-V semiconductors, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InS, InN, InP, InAs, InSb, TlN, TlP, TlAs, TlSb, or mixtures thereof. The thickness of window/emitter layer 230 may be measured and controlled using the systems and methods discussed herein. Front contact 210, which can be a TCO layer, is formed over buffer layer 220. Front support 260 is formed over front contact 210. As shown by the arrows in FIG. 2, light enters photovoltaic device 20 from the side of front support 260.

Atomic layer deposition (ALD) is a thin-film deposition technique based on the sequential use of a gas phase chemical process. During ALD, one or more precursor materials are deposited sequentially in repetition. Following deposition of a front contact, for example, multiple layers of zinc sulfide, zinc oxide, or indium sulfide for example, may be deposited in sequence over several cycles to form the window/emitter layer. The number of cycles could range from about 20 to about 200 cycles. The target thickness of the deposited layer could range from about 10 nm to about 100 nm. Accurate and precise measurement of this thickness (i.e., within 1 nm or less) would be beneficial for high-yield production control.

It is desirable to have a more accurate measurement of the thickness of ALD-grown layers and to provide real-time feedback control during the deposition process. Conventional methods of metrology (i.e., methods of measurement) use spectrometers, for example, to determine a spectrum of reflected light from a device by analyzing layer interference. However, this type of method is not favorable for measuring the thickness of the window/emitter layer of a photovoltaic device, which is very thin. Because the window/emitter layer is very thin, there is not a lot of optical interference at wavelengths that can transmit through the layer. Thus, conventional spectrometer measurement methods are not ideal for use in measuring the thickness of the window/emitter layer.

Colorimeter metrology, in which measurement is based on absorbance and color, however, may be used to determine layer thickness during ALD deposition. Colorimeters generally include a light source, filter, and detector. Colorimeter metrology is performed using either in-line, on-line, or off-line metrology configurations, in reflectance or transmittance mode. Reflectance refers to the fraction of incident electromagnetic power that is reflected at a surface of a material. Transmittance refers to the fraction of incident light that passes through a material. While reflectance mode is described herein, it should be readily understood that the embodiments may be altered to include measurement by transmittance mode.

Absorption of light is relatable to the properties of the material through which the light is travelling by the Beer-Lambert Law, which states:

$T = I/I_o = \exp(-A*L)$ $R = \text{reflection} = L - T$ $A = 4*\text{pi}*k/\text{Lambda}$ where T is transmission, I is the incoming intensity, $I_o$ is the transmitted intensity, A is the absorption coefficient, L is the thickness of the layer, k is the imaginary part of the refractive index that indicates the amount of absorption loss when electromagnetic waves propagate through the material, and Lambda is the wavelength of the light.

Figure 3:
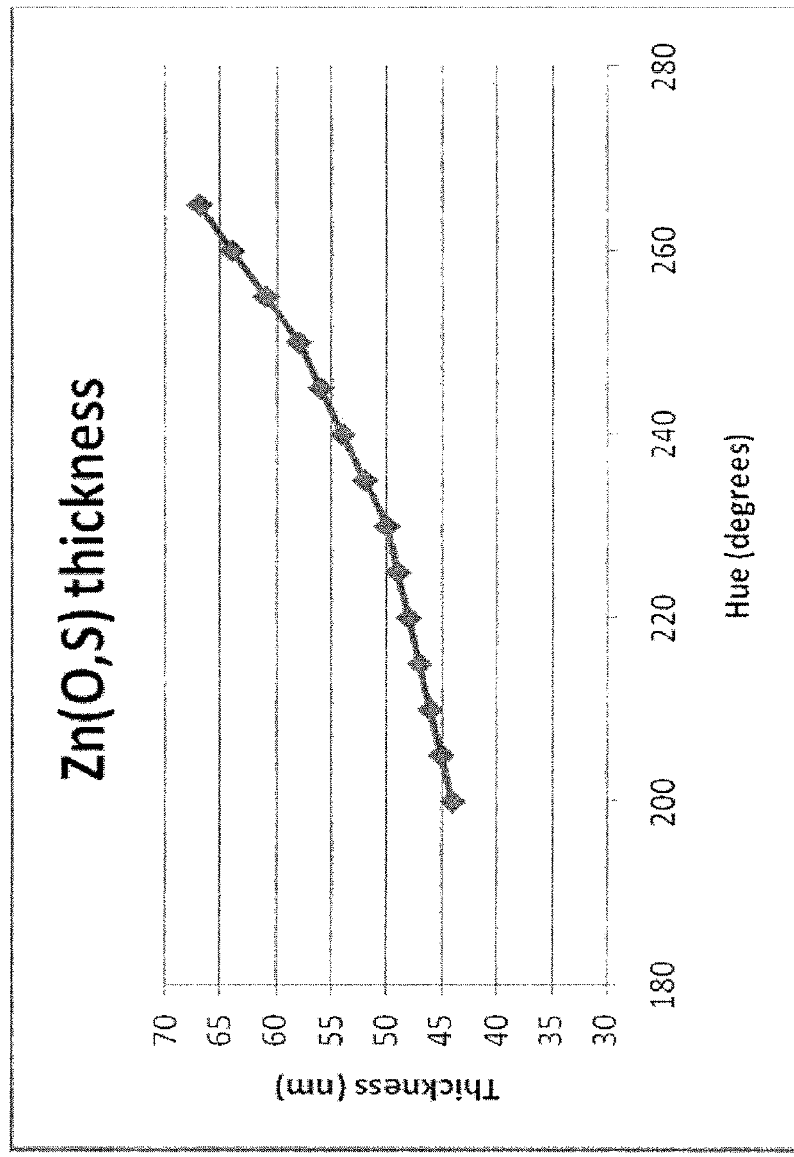
FIG. 3 is a graph illustrating the relationship between zinc oxide or zinc sulfide layer thickness and hue.

Absorption coefficient A is a function of Lambda and thickness. A reflectance- or transmittance-based colorimeter would be sensitive to any changes in Lambda or thickness. Thus, changes in absorbance and transmission can exhibit strong dependence on the layer's thickness. Colorimeter parameters (i.e., ways to describe and characterize color) such as hue, saturation, and intensity are integral definitions of this reflection and transmittance wavelength dependence. These parameters may show strong dependence on a layer's thickness for wavelengths close to the material band-gap. For example, close to the band-gap of the layer material, the wavelength dependence of k is steep. The choice of illumination and collection wavelength can allow for increased sensitivity to the layer thickness and reduced sensitivity to the under-layer thickness. A sensor detects color information about a reflected light beam from a material surface, such as hue, saturation, and intensity. A processor then employs analysis software to use a look-up table (stored in a memory coupled to the processor) to relate hue of the reflected light, for example, to calculate the thickness of the layer. An example hue versus ZnO or ZnS thickness dependence chart is shown in FIG. 3.

Figure 4:
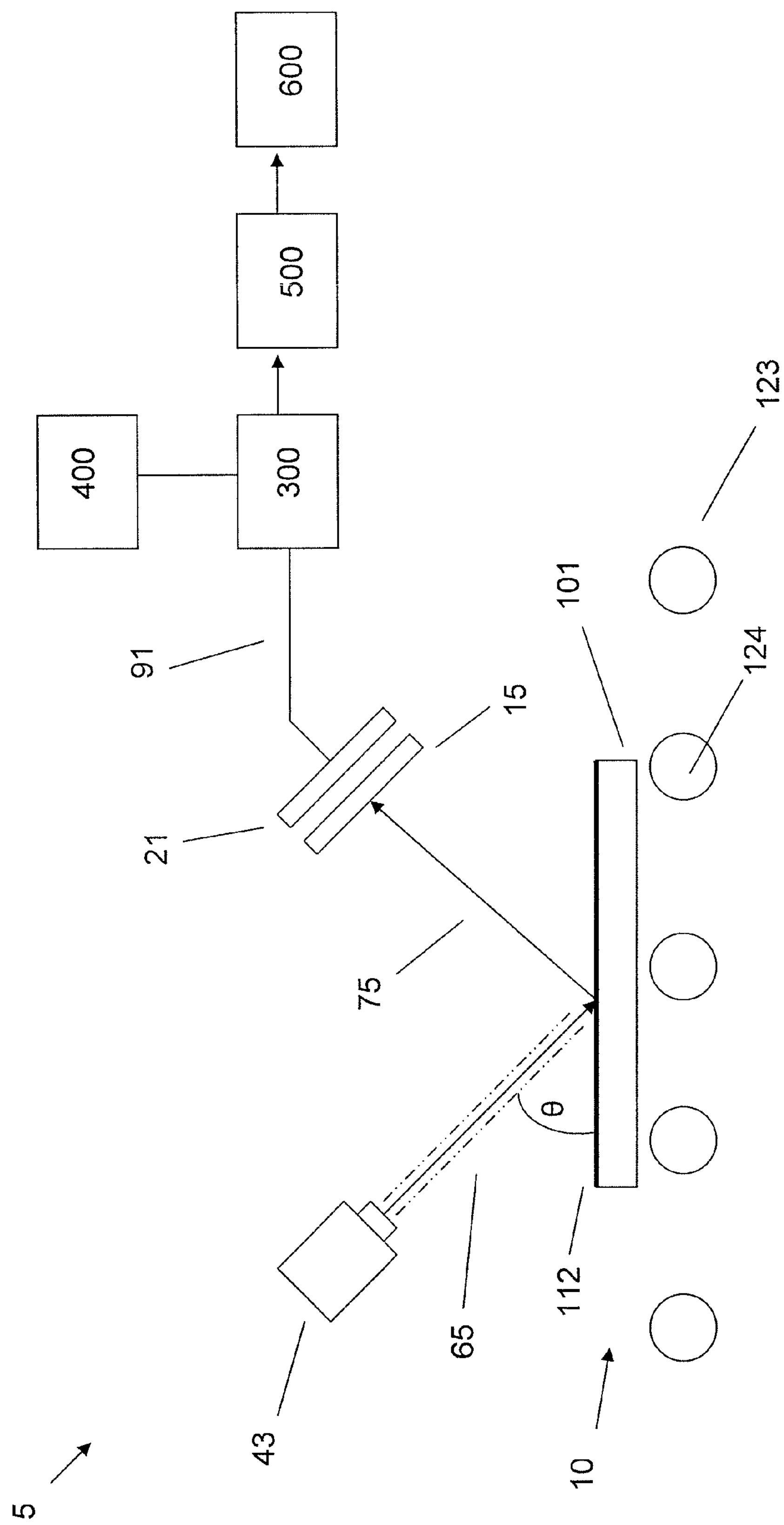
FIG. 4 is a schematic of a colorimeter metrology system for measuring the thickness of a semiconductor layer.

Referring to FIG. 4, a colorimeter metrology system 5 for measuring ALD layer thickness includes optical source 43 for generating optical radiation 65 to illuminate a portion of photovoltaic device 10. Optical radiation 65 includes wide-band and/or narrow-band radiation. Preferably, optical radiation 65 includes wavelengths around where the peak color (i.e., wavelength of maximum emission) is formed. The beam size of optical radiation 65 varies from around 1 μm in diameter to around 100 mm in diameter. The beam divergence of optical radiation 65 varies from about 0.001 numerical aperture (NA) to about 0.5 NA. Optical source 43 emits a continuous wave or pulsed light with or without a lock-in amplifier. A lock-in amplifier (or phase-sensitive detector) is a type of amplifier that can extract a signal with a known carrier wave from an extremely noisy environment. Optical source 43 may be positioned so that it directs optical radiation at photovoltaic device 10 in a direction perpendicular to the substrate or at a grazing angle θ, as shown in FIG. 4.

Colorimeter metrology system 5 also includes sensor 21 for detecting color information related to reflected radiation (i.e., color properties such as hue, saturation, and intensity) from one or more layers 112. Sensor 21 may include any type of detector known in the art, including, but not limited to charge-coupled devices (CCD), complementary metal-oxide semiconductors (CMOS), detector arrays with filters, photomultipliers (PMT), single-lens reflex (SLR), spectrometers, and spectrographs. Colorimeter metrology system 5 also includes a filter 15 positioned in front of sensor 21. Filter 15 may be configured to control the detected wavelength spectrum of reflected radiation 75. A data interface 91 connects sensor 21 to processor 300 where information relating to reflected radiation 75 may be collected and processed. Data interface 91 may include any suitable form of hardwire or wireless communications. Processor 300 may be configured with analysis software to calculate a thickness of at least a portion of layer 112 using the detected hue, saturation, or intensity of reflected radiation 75. In one embodiment, for example, processor 300 may be coupled to a memory 400 that stores a look-up table to relate the hue of radiation 75 to the thickness of the layer deposited using ALD. The look-up table may include data similar to that in the graph shown in FIG. 3 relating ZnO or ZnS thickness to hue. Thus, processor 300 can calculate the thickness of one or more layers 112 based on the detected color characteristics of reflected radiation 75. In another embodiment, processor 300 may include software that utilizes an algorithm for finding the wavelengths around where the peak color (i.e., wavelength of maximum emission) is formed based on information about reflected radiation 75 detected by sensor 21. Processor 300 can then utilize the relationship between wavelengths of peak color and material thickness to calculate the thickness of one or more layers 112.

In colorimeter metrology system 5, photovoltaic device 10 may be positioned on conveyor 123, which may include one or more rollers 124. Conveyor 123 positions photovoltaic device 10 in any suitable orientation to allow analysis of the thickness of one or more layers 112 at various locations. Conveyor 123 moves photovoltaic device 10 in a position to be measured or in a position for additional layer deposition. Colorimeter metrology system 5 may contain a closed loop feedback control system (FCS) 500 to control deposition apparatus 600. The FCS 500 is a computer-integrated control system, which may use the calculated thickness of one or more layers of film to control aspects of the deposition process in real time. The FCS 500 may be monitored and controlled by a central processor or PC, for example, processor 300 shown in FIG. 4.

The FCS may be configured to adjust one or more aspects of the ALD process in real time. For example, processor 300, after calculating the thickness of an ALD-deposited layer, may use FCS 500 to direct deposition apparatus 600 to continue with the ALD process if the thickness has not yet reached the desired amount, or it may issue a stop signal if the layer thickness is at or beyond the desired amount. Processor 300 may also be configured to compare a calculated thickness to a predetermined thickness after a set number of deposition cycles. The predetermined thickness may represent a desired or maximum thickness. If the calculated thickness is substantially less than the predetermined thickness, processor 300 may issue a continue signal to deposition apparatus 600 to continue with the ALD process. If the calculated thickness is substantially close to or higher than the predetermined thickness, processor 300 may issue a stop signal to deposition apparatus 600, in which case the photovoltaic device 10 may be transported to a different stage of the manufacturing process using conveyors 123, or any other suitable transportation means.

Processor 300 may also be configured to adjust the timing of when it executes a comparison between the calculated thickness and a predetermined thickness. For example, processor 300 may initially be configured to compare a calculated thickness to a predetermined thickness every 50 deposition cycles. However, processor 300 may be further configured to compare the calculated thickness to the predetermined thickness every N deposition cycles, where N defines a predetermined number of ALD deposition cycles executed during deposition of the semiconductor material.

During one such comparison, processor 300 may determine that although the calculated thickness is less than the predetermined thickness, the calculated thickness is still substantially close to the predetermined value such that another 50 deposition cycles could result in the actual thickness going well beyond the predetermined. In this scenario, processor 300 may be configured to shorten the cycle-wait-period prior to comparison. In this instance, the processor may continue by executing its comparison function every 10 cycles, until the predetermined is reached.

Processor 300 may be configured to calibrate the thickness to any desired level. For example, the thickness may be calibrated to the nearest 1 nm, 0.5 nm, 0.1 nm, 0.05 nm, or 0.01 nm, by reducing the number of cycles between comparisons. For example, processor 300 may be configured to reduce the value of N if the difference between the calculated thickness and the predetermined thickness is less than 5 nm. N may have an initial value of more than 1 and/or less than 50. A substantially precise thickness could be obtained by executing the comparison function after every cycle.

Figure 5:
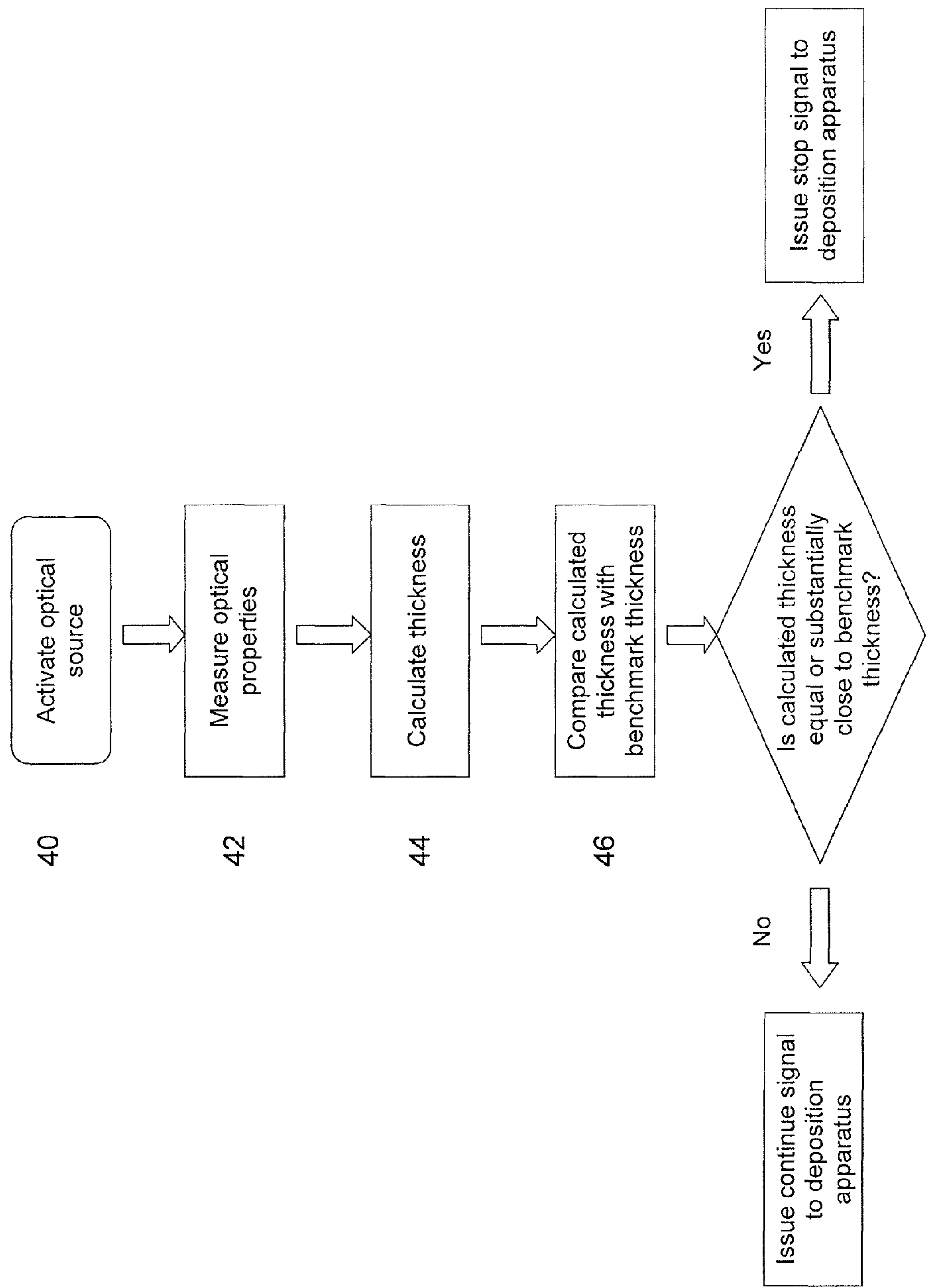
FIG. 5 is a flowchart illustrating a process of using a colorimeter metrology system for measuring the thickness of and depositing a semiconductor layer.

Referring to FIG. 5, a flowchart illustrating a process of using colorimeter metrology system 5 for calculating the thickness and controlling the deposition of an ALD layer is shown. At step 40, an optical source is activated to illuminate a surface of a device. The device may be a photovoltaic device that includes one or more layers, including, for example, one or more semiconductor layers, e.g., a zinc oxide, zinc sulfide, or indium sulfide, deposited using ALD. The surface of the device reflects the light, which is then detected and measured at step 42 by a sensor. Various color parameters of the reflected light may be detected and measured, including, for example, hue, saturation, or intensity. This color information may be received and processed by a central processor 300 or PC. At step 44, the processor 300 uses this color information to calculate the thickness of the portion of the layer illuminated. As described above, in one embodiment, the processor 300 may be coupled to a memory 400 that stores a look-up table to relate hue of the reflected light to the thickness of the layer. Additionally, the processor 300 can calculate thickness based on the wavelengths around where the peak color is foamed. This calculated thickness may be used by the processor 300 to control the continued deposition of the analyzed layer. For example, at step 46, the calculated thickness may be compared to a predetermined thickness. If the calculated thickness is equal or substantially close to the predetermined thickness, the processor 300 may issue a stop signal to deposition apparatus 600, effectively indicating that the desired thickness has already been reached and that the substrate should proceed to a different stage of the manufacturing process. If, however, the calculated thickness is less than the predetermined, the processor may issue a continue signal to deposition apparatus 600, effectively indicating that more deposition cycles are needed to reach a desired thickness. In that case, the process shown in FIG. 5 may be repeated until a desired thickness is achieved.

Figure 6:
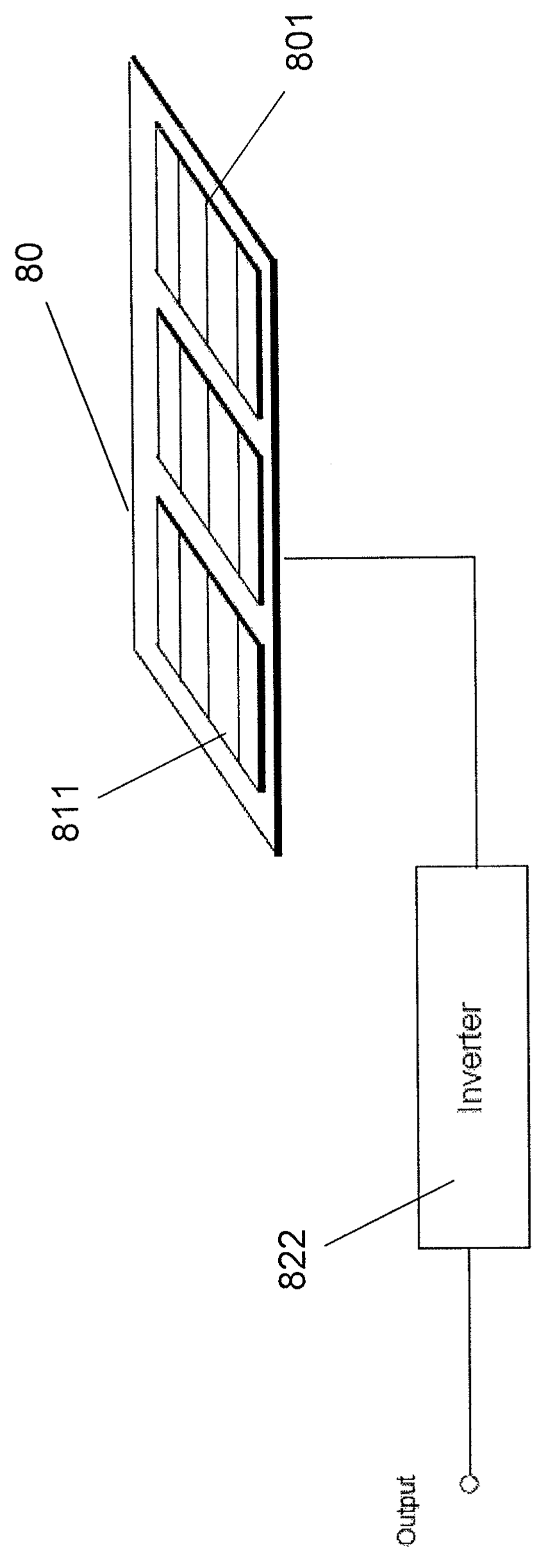
FIG. 6 is a schematic of a photovoltaic array.

Photovoltaic devices fabricated using the methods discussed herein may be incorporated into one or more photovoltaic modules. The modules may be incorporated into various systems for generating electricity. Referring to FIG. 6, by way of example, a photovoltaic array 80 may include one or more interconnected photovoltaic modules 801. One or more of photovoltaic modules 801 may include one or more photovoltaic devices 811 having any of the multilayered structure or photovoltaic device configurations discussed herein. Photovoltaic array 80 may be illuminated with a light source, e.g., the sun, or any suitable artificial light source, to generate a photocurrent. For example, photovoltaic array 80 may be illuminated with a wavelength of light between about 400 nm to about 700 nm. The generated photocurrent may be converted from direct current (DC) to alternating current (AC) using, for example, an inverter 822. Light of any suitable wavelength may be directed at the cell to produce the photocurrent, including, for example, more than 400 nm, or less than 700 nm (e.g., ultraviolet light). Photocurrent generated from one photovoltaic device may be combined with photocurrent generated from other photovoltaic devices. The converted current may be output for any of a variety of uses, including, for example, connection to one or more home appliances, or to a utility grid.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings, but is only limited by the scope of the appended claims.

What is claimed as new and desired to be protected by Letters Patent of the United State is:

1. A material deposition system for depositing a semiconductor material on a photovoltaic module substrate, comprising:

a deposition apparatus for depositing a semiconductor material on a photovoltaic module substrate using atomic layer deposition comprising a plurality of deposition cycles; and a colorimeter comprising:

an optical source configured to illuminate, with optical radiation, a portion of the deposited semiconductor material;

a sensor configured to collect and measure color information related to radiation from the deposited semiconductor material; and a processor coupled to the sensor and configured to receive the color information from the sensor and to use the received color information to calculate a thickness of the deposited semiconductor material, wherein the thickness of the deposited semiconductor material is calculated after every N deposition cycles executed during deposition of the semiconductor material, where N is a predetermined number.

2. The system of claim 1, wherein the semiconductor material is selected from the group consisting of ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InS, InN, InP, InAs, InSb, TlN, TlP, TlAs, TlSb, and mixtures thereof.

3. The system of claim 1, further comprising a memory coupled to the processor, wherein the received color information includes at least one of hue, saturation, and intensity of the reflected radiation, and wherein the memory stores a table relating at least one of hue, saturation, and intensity of the reflected radiation to thickness of the thin-film material.

4. The system of claim 1, wherein the processor includes analysis software to calculate the thickness of the deposited thin-film material.

5. The system of claim 1, wherein a beam size of the optical radiation is about 1 μm in diameter to about 100 mm in diameter.

6. The system of claim 1, wherein a beam divergence of the optical radiation is about 0.001 NA to about 0.5 NA.

7. The system of claim 1, wherein the optical radiation is a continuous wave.

8. The system of claim 1, wherein the optical radiation is pulsed light.

9. The system as in claim 1, wherein the atomic layer deposition apparatus is coupled to the processor and is controlled by the processor in accordance with the calculated thickness of the deposited thin-film material.

10. The system as in claim 3, wherein the color information comprises hue information.

11. A method of controlling the deposition of a semiconductor material on a photovoltaic module substrate, the method comprising the steps of:

forming a conductive material over a photovoltaic module substrate;

depositing semiconductor material over the conductive material by an atomic layer deposition comprising a plurality of atomic layer deposition cycles;

illuminating a portion of the deposited semiconductor material with optical radiation;

using a colorimeter to detect color information related to reflected radiation from the deposited semiconductor material; and calculating a thickness of the deposited semiconductor material based on the detected color information;

comparing the calculated thickness to a predetermined thickness; and controlling whether additional semiconductor material is deposited by the atomic layer deposition based on the result of the comparison;

wherein the step of comparing the calculated thickness to the predetermined thickness occurs after every N deposition cycles executed during deposition of the semiconductor material, wherein N is a predetermined number.

12. The method of claim 11, further comprising the step of outputting a stop signal to a deposition apparatus that is depositing the semiconductor material if the calculated thickness is equal to or greater than the predetermined thickness.

13. The method of claim 11, further comprising the step of outputting a continue signal to a deposition apparatus that is depositing the semiconductor material if the calculated thickness is less than the predetermined thickness.

14. The method of claim 11, wherein the value for N is reduced if a difference between the calculated thickness and the predetermined thickness is less than a predetermined value.

15. The method of claim 11, wherein N has an initial value of between 1 and 50.

16. The method of claim 11, wherein the semiconductor material is selected from the group consisting of ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InS, InN, InP, InAs, InSb, TlN, TlP, TlAs, TlSb, and mixtures thereof.

17. The method of claim 11, wherein the step of calculating the thickness includes using a table stored in a memory of a processor to relate the detected color information, including at least one of hue, saturation, and intensity, to thickness of the semiconductor material.

18. The method of claim 11, wherein the step of calculating the thickness includes using analysis software to calculate the thickness of the deposited semiconductor, wherein the analysis software calculates the thickness by:

determining wavelengths of peak color based on the detected color information, the wavelengths of peak color being the wavelengths of maximum emission, and determining the thickness of the semiconductor material based on a known relationship between the wavelengths of peak color and material thickness.

* * * * *